United States Patent
Hikawa

(10) Patent No.: US 10,797,622 B2
(45) Date of Patent: Oct. 6, 2020

(54) TRIGGER SWITCH

(71) Applicant: Satori S-Tech Co., Ltd., Tokyo (JP)

(72) Inventor: Sei Hikawa, Tokyo (JP)

(73) Assignee: SATORI ELECTRIC CO., LTD., Tokyo (JP)

( * ) Notice: Subject to any disclaimer, the term of this patent is extended or adjusted under 35 U.S.C. 154(b) by 261 days.

(21) Appl. No.: 15/939,924

(22) Filed: Mar. 29, 2018

(65) Prior Publication Data
US 2018/0287521 A1 Oct. 4, 2018

(30) Foreign Application Priority Data
Mar. 30, 2017 (JP) .................. 2017-067446

(51) Int. Cl.
*H02P 6/08* (2016.01)
*H01H 13/08* (2006.01)
(Continued)

(52) U.S. Cl.
CPC .................. *H02P 6/08* (2013.01); *B23Q 5/54* (2013.01); *B25F 5/00* (2013.01); *H01H 13/08* (2013.01); *H01H 15/16* (2013.01); *H02K 7/14* (2013.01); *H02K 11/24* (2016.01); *H02K 11/28* (2016.01); *H03K 17/9625* (2013.01); *H01H 9/06* (2013.01); *H01H 2231/048* (2013.01); *H02P 7/00* (2013.01); *H03K 17/965* (2013.01)

(58) Field of Classification Search
CPC ........ H01H 9/047; H01H 13/00; H01H 15/16; H02K 11/24; H02K 7/14; H02P 6/08; B23Q 5/54
See application file for complete search history.

(56) References Cited

U.S. PATENT DOCUMENTS

| 2012/0068633 A1* | 3/2012 | Watanabe | ............... B25F 5/001 318/3 |
| 2013/0249463 A1* | 9/2013 | Nishikimi | .............. H01H 15/16 318/504 |
| 2017/0144290 A1* | 5/2017 | Tsutsui | ...................... G01L 1/22 |

FOREIGN PATENT DOCUMENTS

| EP | 2 639 016 | 9/2013 |
| EP | 2 656 976 | 10/2013 |

(Continued)

OTHER PUBLICATIONS

Extended European Search Report dated Aug. 29, 2018 in European application No. 18164845.2.

*Primary Examiner* — Eduardo Colon Santana
*Assistant Examiner* — Said Bouziane
(74) *Attorney, Agent, or Firm* — Wenderoth, Lind & Ponack, L.L.P.

(57) ABSTRACT

It is enabled to facilitate fine adjustment of power as well as reduction of the amount of movement required to maximize the power. An actuator 13 is moved by operation of a user. A pressure sensitive sensor 15 detects applied pressing force. A pressing member 14 presses the pressure sensitive sensor 15. When the amount of movement of the actuator 13 is smaller than a predetermined amount, the pressing member 14 presses the pressure sensitive sensor 15 to apply force corresponding to the amount of movement of the actuator 13. When the amount of movement of the actuator 13 is not smaller than the predetermined amount, the pressing member 14 presses the pressure sensitive sensor 15 to apply force corresponding to pressing force applied to the actuator 13 by the user.

12 Claims, 3 Drawing Sheets

(51) Int. Cl.
*B25F 5/00* (2006.01)
*H03K 17/96* (2006.01)
*H02K 11/24* (2016.01)
*H02K 11/28* (2016.01)
*B23Q 5/54* (2006.01)
*H01H 15/16* (2006.01)
*H02K 7/14* (2006.01)
*H03K 17/965* (2006.01)
*H02P 7/00* (2016.01)
*H01H 9/06* (2006.01)

(56) References Cited

FOREIGN PATENT DOCUMENTS

| | | |
|---|---|---|
| JP | 39-23167 | 10/1964 |
| JP | 2012-101326 | 5/2012 |
| JP | 2012-252554 | 12/2012 |

\* cited by examiner

TRIGGER SWITCH

TECHNICAL FIELD

The present invention is related to a trigger switch.

BACKGROUND ART

Patent Literature 1 discloses a speed change switch for increasing and decreasing the amount of electric power supplied to a motor in proportion to the amount of displacement of a switch actuator.

Patent Literature 2 discloses a load indicator for detecting a load applied to a load transmission member with a strain receiptor.

PRIOR ART DOCUMENTS

Patent Literature

Patent Literature 1: JP 2012-252554 A
Patent Literature 2: JP 39-23167 B

SUMMARY OF INVENTION

Technical Problem

In the speed change switch disclosed in Patent Literature 1, conversion of the amount of displacement of a switch actuator to pressing force applied to a load sensor with an elastic body enables a small amount of the displacement required to maximize a rotation speed of the motor. However, the small amount of the displacement of the switch actuator between the state where the motor is stopped and the state where the motor is rotated with maximum speed makes fine adjustment of the rotation speed of the motor difficult.

The smaller spring constant of the elastic body increases the moving distance of the switch actuator between the state where the motor is stopped and the state where the motor is rotated with maximum speed. This enables the fine adjustment of the rotation speed of the motor. However, large movement of the switch actuator is required to maximize the rotation of the motor.

Instead of conversion of the amount of displacement of the actuator to pressing force, transmission of the pressing force applied to the actuator to the load sensor as it is enables to increase and decrease the rotation speed of the motor with little movement of the actuator. However, this also results in difficulty in fine adjustment of the rotation speed of the motor, because the rotation speed of the motor is controlled in proportion to a degree of force applied to the actuator, instead of the amount of displacement of the actuator.

The present invention aims to solve such problems, that is, to enable to facilitate fine adjustment of electric power supplied to a motor or other loads, as well as reduction of the amount of movement of the actuator required to maximize the electric power supplied to the load.

Solution to Problem

A trigger switch according to the present invention may include an actuator to be moved by operation of a user, a pressure sensitive sensor to detect applied pressing force, and a pressing member to press the pressure sensitive sensor. When the amount of movement of the actuator is smaller than a predetermined amount, the pressing member may press the pressure sensitive sensor to apply force corresponding to the amount of movement of the actuator. When the amount of movement of the actuator is not smaller than the predetermined amount, the pressing member may press the pressure sensitive sensor to apply force corresponding to pressing force applied to the actuator by the user.

The trigger switch may include a conversion member to convert the amount of movement of the actuator to force. When the amount of movement of the actuator is smaller than the predetermined amount, the pressing member may be linked to the actuator via the conversion member, and thereby may press the pressure sensitive sensor to apply the force converted by the conversion member. When the amount of movement of the actuator is not smaller than the predetermined amount, the pressing member may be linked to the actuator directly without intervention of the conversion member, and thereby may press the pressure sensitive sensor to apply the pressing force applied to the actuator by the user.

When the amount of movement of the actuator is smaller than a second predetermined amount, the pressing member need not press the pressure sensitive sensor.

The trigger switch may include a limitation part to limit the pressing force applied from the pressing member to the pressure sensitive sensor within a predetermined value.

A trigger switch according to the present invention may include an actuator movable between an OFF position and a maximum position, biased toward the OFF position, and to be moved toward the maximum position by operation of a user, a pressure sensitive sensor to detect applied pressing force, a pressing member to press the pressure sensitive sensor, and a compression spring intervening between the actuator and the pressing member. When the actuator is located near the OFF position in comparison to a threshold position, the pressing member may be linked to the actuator via the compression spring, and thereby may press the pressure sensitive sensor to apply force corresponding to the position of the actuator. When the actuator is located at the threshold position, the pressing member may abut the actuator directly without intervention of the compression spring, and thereby may press the pressure sensitive sensor to apply pressing force applied to the actuator by the user.

When the actuator is located near the OFF position in comparison to an actuation position, the pressing member may be apart from the pressure sensitive sensor.

The pressure sensitive sensor may be movable between a pressure sensitive position and a protected position, and biased toward the pressure sensitive position. When the pressing force applied from the pressing member to the pressure sensitive sensor reaches a predetermined value, the pressure sensitive sensor may move toward the protected position, thereby the actuator may reach the maximum position, so as to prevent application of pressing force larger than the predetermined value to the pressure sensitive sensor.

The trigger switch may control an electric power supplied to a load based on the force detected by the pressure sensitive sensor.

The trigger switch may control a rotation speed of a motor based on the force detected by the pressure sensitive sensor.

An electric power tool according to the present invention may include a motor, and the trigger switch. The electric power tool may control a rotation speed of the motor based on the force detected by the pressure sensitive sensor.

Advantageous Effects of Invention

In the present invention, pressing of the pressure sensitive sensor with force corresponding to the amount of movement of the actuator in the case of the amount of movement of the actuator smaller than the predetermined amount enables to facilitate adjustment of the pressing force. Pressing of the pressure sensitive sensor with force corresponding to pressing force applied to the actuator in the case of the amount of movement of the actuator not smaller than the predetermined amount enables to maximize the pressing force without large movement of the actuator.

Linkage of the pressing member to the actuator directly without the conversion member in the case of the amount of movement of the actuator not smaller than the predetermined amount enables to maximize the pressing force with little movement of the actuator.

Lack of pressing the pressing member in the case of the amount of movement of the actuator smaller than the second predetermined amount enables to prevent unintentional pressing of the pressing member.

Limitation of pressing force applied from the pressing member to the pressure sensitive sensor enables to prevent application of force larger than the allowable pressing force to the pressure sensitive sensor.

Control of the electric power supplied to the load based on force detected by the pressure sensitive sensor enables to facilitate fine adjustment of the electric power supplied to the load, as well as reduction of the amount of movement of the actuator required to maximize the electric power supplied to the load.

Control of the rotation speed of the motor based on force detected by the pressure sensitive sensor enables to facilitate fine adjustment of the rotation speed of the motor, as well as reduction of the amount of movement of the actuator required to maximize the rotation speed of the motor.

EMBODIMENTS

Figure 1:
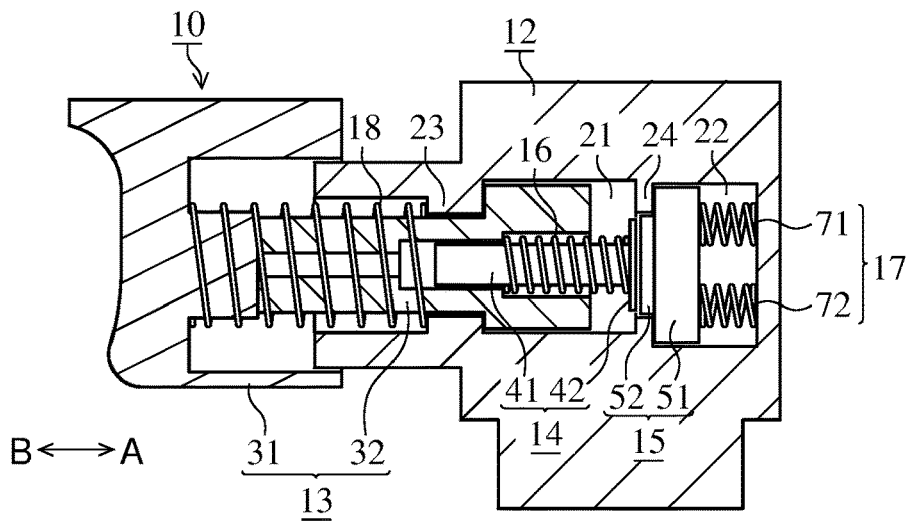
FIG. 1 illustrates a partial sectional side view of an exemplary trigger switch.

A trigger switch 10, shown in FIG. 1, is used for adjustment of a electric power supplied to a load, such as a motor, in an electric power tool including the load, for example.

The trigger switch 10 includes a body 12. The body 12 has two accommodation spaces 21 and 22 provided inside it, and two partitions 23 and 24. The partition 23 is disposed in the B direction from the accommodation space 21, and separates the accommodation space 21 from outside. The partition 23 is provided with a penetration hole communicating the accommodation space 21 and the outside. The partition 24 is disposed in the A direction from the accommodation space 21 and in the B direction from the accommodation space 22, and separates the two accommodation spaces 21 and 22. The partition 24 is provided with a penetration hole communicating the accommodation spaces 21 and 22.

The trigger switch 10 includes an actuator 13. The actuator 13 is movable relatively to the body 12 along the A-B direction between the OFF position, shown in FIG. 1, and the maximum position, shown in FIG. 6. The actuator 13 has a trigger 31 and a plunger 32. The trigger 31 is disposed outside the body 12, so that the user can pull it with his finger. The plunger 32 penetrates the penetration hole penetrating the partition 23, so that its one end is disposed inside the accommodation space 21 and its other end is engaged and fixed to the trigger 31 outside the body 12. The plunger 32 has an cylindrical shaft shape, for example, extending along the A-B direction, and a hole extending along its central axis. This hole is recessed from an end part of the plunger 32 in the A direction. Its diameter is stepwisely reduced two times with the advance toward the B direction. When the user pulls the trigger 31, the plunger 32 moves unitarily with the trigger 31. This causes movement of the entire actuator 13 toward the A direction.

The trigger switch 10 includes a biasing member 18, such as a compression herical spring, called return spring, or other elastic bodies. The biasing member 18 is disposed between the body 12 and the trigger 31, and biases the trigger 31 toward the B direction against the body 12. This makes the actuator 13 located at the OFF position when the user does not pull the trigger 31. When the user pulls the trigger 31, the actuator 13 moves toward the A direction.

Figure 2:
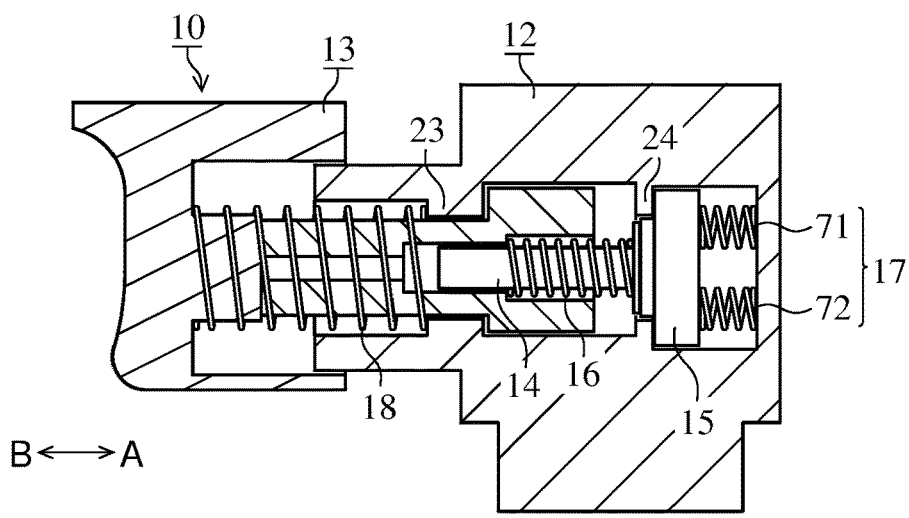
FIG. 2 illustrates a partial sectional side view of the trigger switch.

The trigger switch 10 includes a pressing member 14. The pressing member 14 is disposed within the accommodation space 21. The pressing member 14 engages the plunger 32, and is movable relatively to the actuator 13 along the A-B direction between the free position, shown in FIGS. 1 and 2, and the direct link position, shown in FIGS. 4 to 6. The pressing member 14 has, for example, a shaft part 41 with a cylindrical shape extending along the A-B direction, and a flange part 42 with a disc shape provided at an end part of the shaft part 41 in the A direction. The shaft part 41 has a diameter smaller than the inner diameter of the hole of the plunger 32 at its second step and larger than the inner diameter at its third step. When the user pulls the trigger 31, the pressing member 14 moves toward the A direction, and presses a pressure sensitive sensor 15 described below.

The trigger switch 10 includes a conversion member 16, such as a compression herical spring, called push spring, or other elastic bodies. The conversion member 16 is disposed between the plunger 32 and the pressing member 14, and converts the amount of movement of the actuator 13 to pressing force applied from the pressing member 14 to the pressure sensitive sensor 15. The conversion member 16 has, for example, the inner diameter larger than the diameter of the shaft part of the pressing member 14 and smaller than the diameter of the flange part 42 of the pressing member 14, and the outer diameter smaller than the inner diameter of the hole of the pressing member 14 at its first step and larger than the inner diameter at its second step.

When the pressing member 14 is located at the direct link position relative to the actuator 13, the pressing member 14 abuts the actuator 13, and is directly linked with the actuator 13 without intervention of the conversion member 16. For example, the end face of the pressing member 14 in the B direction abuts the interface between the second step and the third step of the hole of the plunger 32. This causes the pressing member 14 to transmit the pulling force applied to the trigger 31 by the user to the pressure sensitive sensor 15.

When the pressing member 14 is located at other than the direct link position, the pressing member 14 is linked to the actuator 13 via the conversion member 16. This causes the pressing member 14 to press the pressure sensitive sensor 15 with force converted by the conversion member 16.

The trigger switch 10 includes the pressure sensitive sensor 15. The pressure sensitive sensor 15 is movable relatively to the body 12 along the A-B direction between the pressure sensitive position, shown in FIGS. 1 to 4, and the protected position, shown in FIG. 6. The pressure sensitive sensor 15 has a base part 51 and a pressure sensitive part 52. The base part 51 is disposed within the accommodation space 22. The pressure sensitive part 52 is disposed on the base part 51 in the B direction, and faces the accommodation space 21 through the penetration hole of the partition 24. The pressure sensitive part 52 detects compression force along the A-B direction to output a signal indicating magnitude of the detected force. For example, the pressure sensitive part 52 changes its resistance value or produces electromotive force in response to the detected force. The pressure sensitive part 52 is compressed between the pressing member 14 and the base part 51 to detect the pressing force from the pressing member 14.

The trigger switch 10 includes a limitation part 17. The limitation part 17 limits pressing force applied from the pressing member 14 to the pressure sensitive sensor 15. The limitation part 17 has, for example, biasing members 71 and 72, such as a compression herical spring, called receive spring, or other elastic bodies. The biasing members 71 and 72 are disposed within the accommodation space 22, and biases the base part 51 toward the B direction against the body 12. Thereby, the pressure sensitive sensor 15 is located at the pressure sensitive position to detect the pressing force applied from the conversion member 16 as it is in the case of the pressing force applied from the conversion member 16 to the pressure sensitive sensor 15 smaller than the biasing force applied from the biasing members 71 and 72. When the pressing force applied from the conversion member 16 exceeds the biasing force applied from the biasing members 71 and 72, the pressure sensitive sensor 15 moves toward the A direction. When reaching the maximum position, the actuator 13 can not further move toward the A direction. This enables to prevent application of force larger than it to the pressure sensitive sensor 15.

Now, the behavior is discussed.

Figure 7:
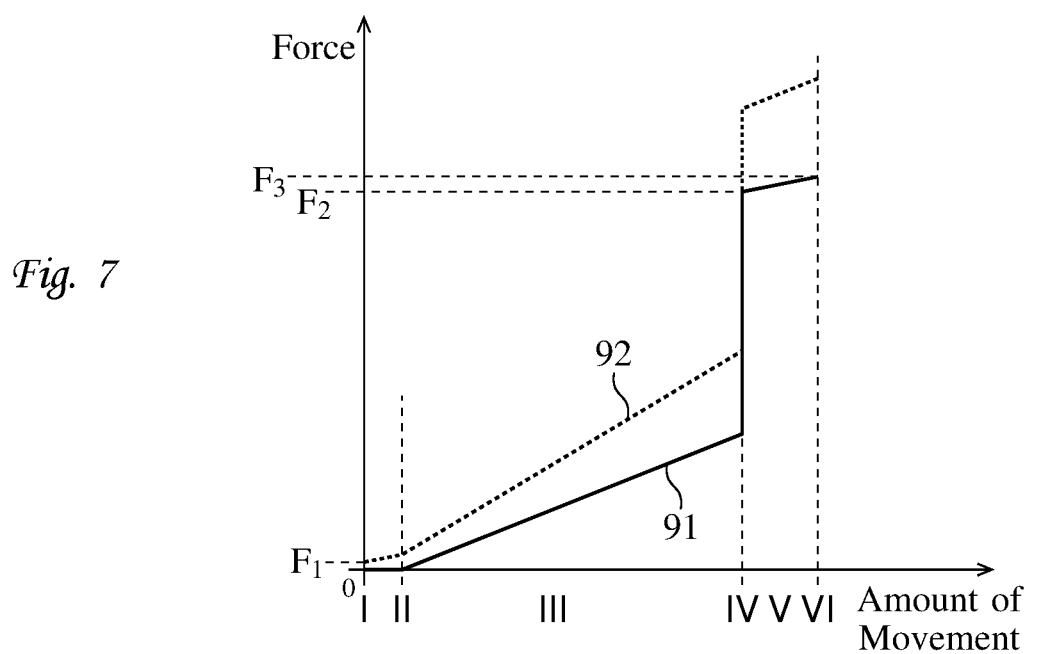
FIG. 7 is a graph illustrating relationship between a pressing force and the amount of movement of the actuator.

In FIG. 7, the horizontal axis indicates the amount of movement of the actuator 13 toward the A direction in reference to the OFF position. The roman numerals show figure numbers corresponding to the amount of movement. For example, the amount of movement I is corresponding to the state illustrated in FIG. 1. The vertical axis indicates force. The solid line shows the pressing force 91 detected by the pressure sensitive sensor 15, while the dotted line shows the pulling force 92 applied to the trigger 31 by the user. The difference between the force 92 and the pressing force 91 is mainly caused by the biasing force of the biasing member 18.

When the user does not pull the trigger 31, the actuator 13 is located at the OFF position relative to the body 12, while the pressing member 14 is located at the free position relative to the actuator 13, as shown in FIG. 1. In this case, the plunger 32 abuts the partition 23, and thereby is prevented from further movement toward the B direction. The base part 51 of the pressure sensitive sensor 15 abuts the partition 24, and thereby is also prevented from further movement toward the B direction. The compression herical spring of the conversion member 16 has the same length as its free length. The free length of the compression herical spring of the conversion member 16 is shorter than the length required to make the pressing member 14 into contact with the pressure sensitive sensor 15. This causes the pressing member 14 apart from the pressure sensitive sensor 15. Since the pressing member 14 does not press the pressure sensitive sensor 15, the pressing force 91 detected by the pressure sensitive sensor 15 is zero.

When the user pulls the trigger 31 with the force 92 smaller than the biasing force $F_1$ of the biasing member 18, the actuator 13 does not move, and remains at the OFF position. When the pulling force 92 applied to the trigger 31 exceeds the biasing force $F_1$, the biasing member 18 is compressed and the actuator 13 moves toward the A direction. However, the pressing force 91 detected by the pressure sensitive sensor 15 remains zero until the pressing member 14 becomes in contact with the pressure sensitive sensor 15. This prevents detection of the pressing force by the pressure sensitive sensor 15 even when the trigger 31 is touched unintentionally. So, this enables to prevent unintentional supply of electric power to the load.

Increase of the pulling force 92 applied to the trigger 31 causes further compression of the biasing member 18. When the actuator 13 reaches the actuation position shown in FIG. 2, the pressing member 14 becomes in contact with the pressure sensitive sensor 15. The amount of movement of the actuator 13 at this time is called "second predetermined amount."

Figure 3:
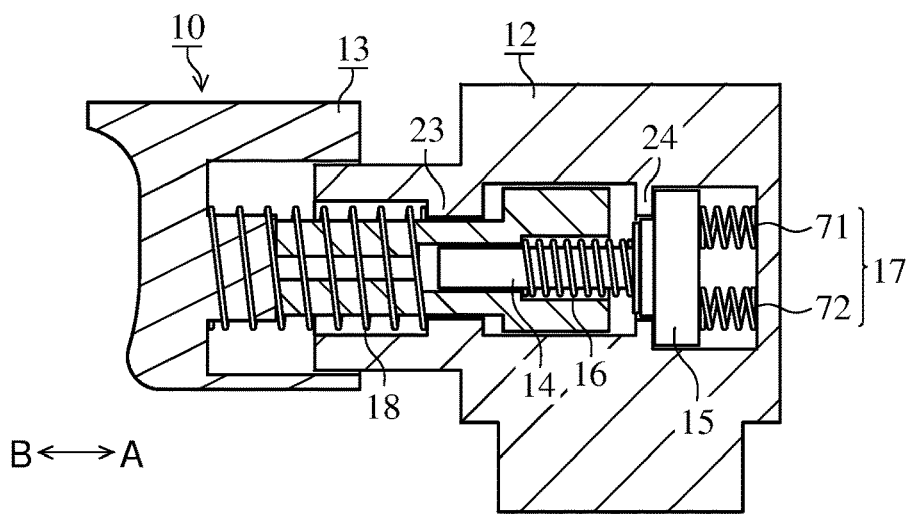
FIG. 3 illustrates a partial sectional side view of the trigger switch.

Further increase of the pulling force 92 applied to the trigger 31 causes further compression of the biasing member 18. While the actuator 13 moves toward the A direction, the pressing member 14 does not moves because of contact with the pressure sensitive sensor 15. This causes the compression herical spring of the conversion member 16 to be compressed, as shown in FIG. 3, and thereby to press the pressing member 14 with force in proportion to the amount of compression. The pressure sensitive sensor 15 detects the pressing force by the compression herical spring of the conversion member 16 via the pressing member 14. In other words, the pressing force 91 detected by the pressure sensitive sensor 15 is proportional to the amount of movement of the actuator 13 from the actuation position as reference. The ratio of the amount of movement of the actuator 13 to the pressing force 91 is determined by the spring constant of the compression herical spring of the conversion member 16. This allows relatively free setting. Smaller spring constant realizes smaller change of the pressing force 91 in contrast with the amount of movement of the actuator 13. This enables to facilitate fine adjustment of electric power supplied to the load when the electric power supplied to the load is relatively small, such that the motor is intended to rotate with low speed. In contrast, larger spring constant realizes larger change of the pressing force 91 in contrast with the amount of movement of the actuator 13. This enables to control the electric power supplied to the load through the amount of movement of the actuator 13 when the electric power supplied to the load is moderate, such that the motor is intended to rotate with moderate speed.

Figure 4:
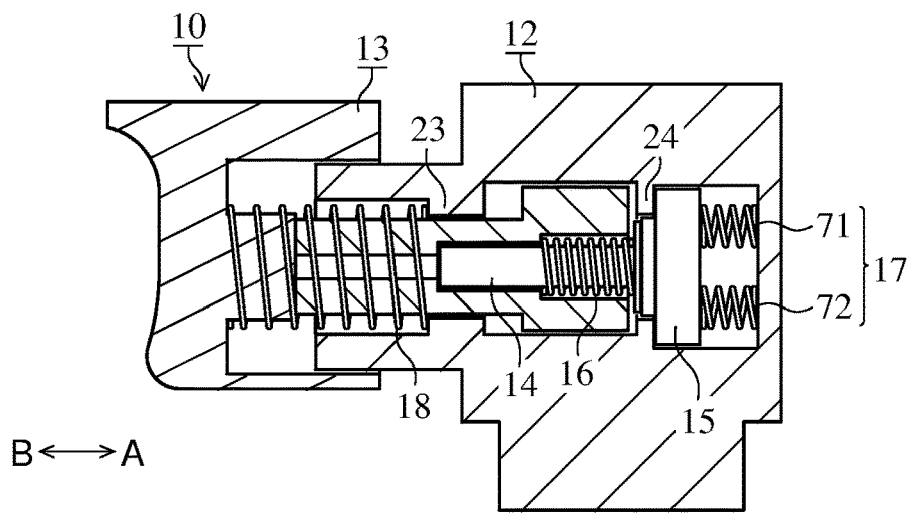
FIG. 4 illustrates a partial sectional side view of the trigger switch.

Further increase of the pulling force 92 applied to the trigger 31 causes further compression of the compression herical spring of the conversion member 16 and the biasing member 18. The actuator 13 reaches the threshold position, as shown in FIG. 4. The amount of movement of the actuator 13 at this time is called "predetermined amount." At this time, the pressing member 14 reaches the direct link position relative to the actuator 13. Direct linkage of the pressing member 14 to the actuator 13 without intervention of the conversion member 16 prevents further compression of the compression herical spring of the conversion member 16. The pressure sensitive sensor 15 detects the pulling force 92 applied to the trigger 31 by the user via the pressing member 14. The pressing force 91 detected by the pressure sensitive sensor 15 is the remainder of the biasing force by the compression herical spring of the conversion member 16 and the biasing member 18 subtracted from the pulling force 92 applied to the trigger 31 by the user. The threshold position is determined by the direct link position of the pressing member 14. This allows relatively free setting. For example, the direct link position can be changed by changing the position of the boundary between the second step and the third step of the hole of the plunger 32, or by changing the length of the shaft part of the pressing member 14. Larger distance between the actuation position and the threshold position can realize broader range where easy fine adjustment of the electric power supplied to the load is enabled. In contrast, smaller distance between the actuation position and the threshold position can realize smaller amount of movement of the actuator 13.

Further increase of the pulling force 92 applied to the trigger 31 enhances the force 91 detected by the pressure sensitive sensor 15. However, the actuator 13 does not move because of direct linkage to the pressing member 14. Thereby, large movement of the actuator 13 is not required for relatively large electric power supplied to the load, such that the motor is intended to rotate with maximum speed.

Figure 5:
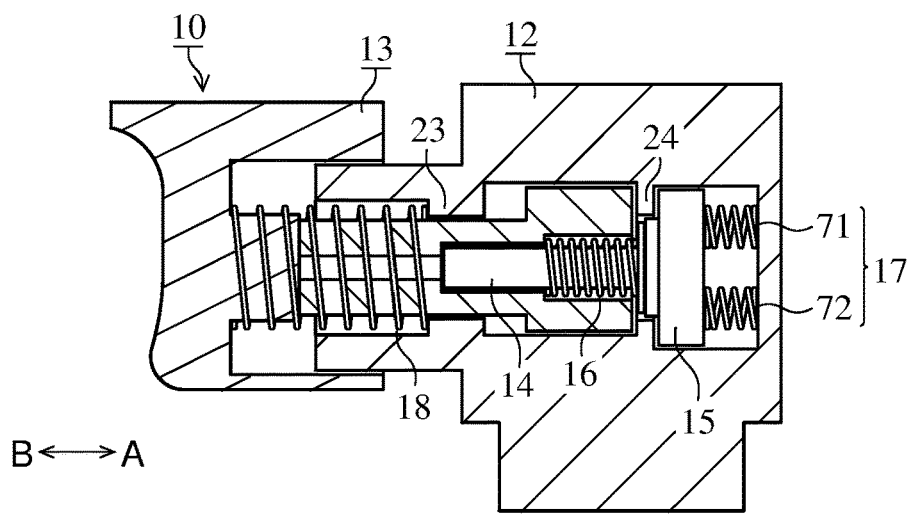
FIG. 5 illustrates a partial sectional side view of the trigger switch.

Further increase of the pulling force 92 applied to the trigger 31 causes the pressing force 91 applied from the pressing member 14 to the pressure sensitive sensor 15 to exceed the biasing force $F_2$ by the biasing members 71 and 72 of the limitation part 17. This causes movement of the pressure sensitive sensor 15 toward the A direction, as shown in FIG. 5. This accompanies movement of the actuator 13 toward the A direction. This realizes limitation of the pressing force applied to the pressure sensitive sensor 15.

Figure 6:
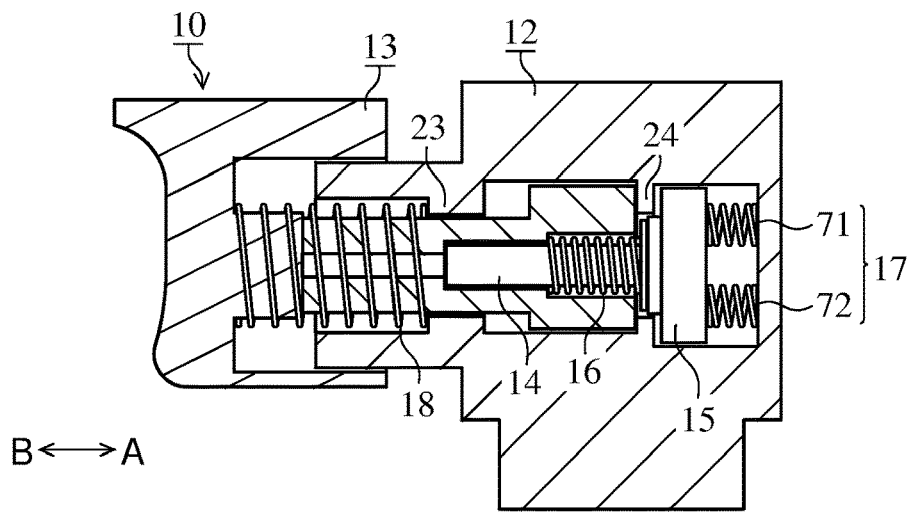
FIG. 6 illustrates a partial sectional side view of the trigger switch.

Further increase of the pulling force 92 applied to the trigger 31 causes the actuator 13 to reach the maximum position, as shown in FIG. 6. At this time, the plunger 32 abuts the partition 24, and thereby is prevented from further movement toward the A direction. This enables to limit the pressing force 92 applied to the pressure sensitive sensor 15 under the maximum pressing force $F_3$. This prevents failure and/or breakdown of the pressure sensitive sensor 15 caused by overload.

The maximum pressing force F3 is determined by the biasing force exerted by the biasing members 71 and 72 of the limitation part 17 when the actuator 13 is located at the maximum position. This allows relatively free setting. This enables to utilize the allowable load range of the pressure sensitive sensor 15 as much as possible.

In this manner, the pressure sensitive sensor 15 detects force corresponding to the amount of movement of the actuator 13, when the actuator 13 is located in the B direction from the threshold position. This enables to facilitate fine adjustment of the power within the moderate or low power range. When the actuator 13 is located at the threshold position, the pressure sensitive sensor 15 detects force corresponding to the pressing force applied to the actuator 13. This enables to reduce the amount of movement of the actuator 13 required to maximize the power.

Easy setting is achieved in the range where the power can easily be finely adjusted, the amount of movement of the actuator 13 for it, the maximum value of the pressing force applied to the pressure sensitive sensor 15, and/or others. This enables to realize required characteristics.

Separation between the biasing member 18 and the conversion member 16 prevents increase of the pressing force applied to the pressure sensitive sensor 15 even when the biasing force of the biasing member 18 is increased. This enables to enhance returning force used for returning the actuator 13 to the OFF position while the pressing force detected by the pressure sensitive sensor 15 is not changed.

The above described embodiments are examples to make it easier to understand the present invention. The present invention is not limited to the example, and includes any modified, altered, added, or removed variations, without departing from the scope of the claims attached herewith. This can be easily understood by persons skilled in the art.

For example, the trigger switch 10 may include microcomputer or other control circuits for controlling the electric power supplied to the load based on the pressing force detected by the pressure sensitive sensor 15. The trigger switch 10 may include a main contact for blocking the electric power supplied to the control circuit when the actuator 13 is located at the OFF position. The main contact may be configured to turn on when the actuator 13 is located in the A direction from a predetermined position. The position for turning on of the main contact may be in the A direction from the actuation position. This enables to prevent supply of the electric power to the load until the main contact turns on. This enables to maintain the position constant where the supply of the electric power starts, even when unconstancy of the free length of the compression herical spring of the conversion member 16, or other factors results in unconstancy of the actuation position.

REFERENCE SIGNS LIST

10: trigger switch; 12: body; 21 and 22: accommodation space; 23 and 24: partition; 13: actuator; 31: trigger; 32: plunger; 14: pressing member; 41: shaft part; 42: flange; 15: pressure sensitive sensor; 51: base part; 52: pressure sensitive part; 16: conversion member; 17: limitation part; 18, 71 and 72: biasing member; and, 91 and 92: force.

The invention claimed is:
1. A trigger switch, comprising:
an actuator movable by operation of a user;
a pressure sensitive sensor for detecting applied pressing force;
a pressing member for pressing the pressure sensitive sensor; and
a conversion member for converting an amount of movement of the actuator to force,
wherein, when the amount of movement of the actuator is smaller than a predetermined amount, the pressing member is linked to the actuator via the conversion member, and thereby presses the pressure sensitive sensor to apply the force converted by the conversion member, and
when the amount of movement of the actuator is not smaller than the predetermined amount, the pressing member is linked to the actuator directly without intervention of the conversion member, and thereby presses the pressure sensitive sensor to apply pressing force applied to the actuator by the user.
2. The trigger switch of claim 1, wherein, when the amount of movement of the actuator is smaller than a second predetermined amount, the pressing member does not press the pressure sensitive sensor.
3. The trigger switch of claim 1, further comprising a limitation part for limiting the pressing force applied from the pressing member to the pressure sensitive sensor within a predetermined value.

4. The trigger switch of claim 1, wherein an electric power supplied to a load is controlled based on the force detected by the pressure sensitive sensor.

5. The trigger switch of claim 1, wherein a rotation speed of a motor is controlled based on the force detected by the pressure sensitive sensor.

6. An electric power tool, comprising:
a motor; and
the trigger switch of claim 1, wherein a rotation speed of the motor is controlled based on the force detected by the pressure sensitive sensor.

7. A trigger switch, comprising:
an actuator movable between an OFF position and a maximum position, the actuator being biased toward the OFF position, and movable toward the maximum position by operation of a user;
a pressure sensitive sensor for detecting applied pressing force;
a pressing member for pressing the pressure sensitive sensor; and
a compression spring intervening between the actuator and the pressing member,
wherein, when the actuator is located near the OFF position in comparison to a threshold position, the pressing member is linked to the actuator via the compression spring, and thereby presses the pressure sensitive sensor to apply force converted by the compression spring and corresponding to the position of the actuator, and
when the actuator is located at the threshold position, the pressing member abuts the actuator directly without intervention of the compression spring, and thereby presses the pressure sensitive sensor to apply pressing force applied to the actuator by the user.

8. The trigger switch of claim 7, wherein, when the actuator is located near the OFF position in comparison to an actuation position, the pressing member is apart from the pressure sensitive sensor.

9. The trigger switch of claim 7, wherein
the pressure sensitive sensor is movable between a pressure sensitive position and a protected position, and biased toward the pressure sensitive position, and
when the pressing force applied from the pressing member to the pressure sensitive sensor reaches a predetermined value, the pressure sensitive sensor moves toward the protected position, and thereby the actuator reaches the maximum position, so as to prevent application of pressing force larger than the predetermined value to the pressure sensitive sensor.

10. The trigger switch of claim 7, wherein an electric power supplied to a load is controlled based on the force detected by the pressure sensitive sensor.

11. The trigger switch of claim 7, wherein a rotation speed of a motor is controlled based on the force detected by the pressure sensitive sensor.

12. An electric power tool, comprising:
a motor; and
the trigger switch of claim 7, wherein a rotation speed of the motor is controlled based on the force detected by the pressure sensitive sensor.

\* \* \* \* \*